US 9,438,214 B2

(12) United States Patent
Yen

(10) Patent No.: US 9,438,214 B2
(45) Date of Patent: Sep. 6, 2016

(54) DC OFFSET CANCELLATION CIRCUIT

(71) Applicant: RDC Semiconductor Co., Ltd., Hsinchu (TW)

(72) Inventor: Ming-Chou Yen, Hsinchu (TW)

(73) Assignee: RDC SEMICONDUCTOR CO., LTD., Hsinchu (TW)

( * ) Notice: Subject to any disclaimer, the term of this patent is extended or adjusted under 35 U.S.C. 154(b) by 124 days.

(21) Appl. No.: 14/529,924

(22) Filed: Oct. 31, 2014

(65) Prior Publication Data

US 2015/0188525 A1  Jul. 2, 2015

(30) Foreign Application Priority Data

Dec. 27, 2013 (TW) .............................. 102148782 A

(51) Int. Cl.
| H03K 5/00 | (2006.01) |
| H03K 5/003 | (2006.01) |
| H03F 1/30 | (2006.01) |
| H03K 5/007 | (2006.01) |

(52) U.S. Cl.
CPC .............. H03K 5/003 (2013.01); *H03F 1/304* (2013.01); *H03F 2200/375* (2013.01); *H03F 2203/45212* (2013.01); *H03K 5/007* (2013.01)

(58) Field of Classification Search
None
See application file for complete search history.

(56) References Cited

U.S. PATENT DOCUMENTS

| 4,229,703 A * | 10/1980 | Bustin ..................... H03F 1/304 327/307 |
| 5,798,664 A * | 8/1998 | Nagahori ................ H03F 3/087 327/307 |
| 6,426,663 B1 * | 7/2002 | Manlove .................. G01P 1/006 327/307 |
| 6,507,241 B1 * | 1/2003 | Ritter .................. H03F 3/45941 327/307 |
| 7,268,624 B2 | 9/2007 | Chen et al. |
| 8,238,761 B2 | 8/2012 | Liu et al. |
| 2002/0109075 A1 * | 8/2002 | Ono ........................ H03F 3/087 250/214 A |
| 2004/0100317 A1 * | 5/2004 | Suzunaga .............. H04B 10/69 327/307 |
| 2006/0132235 A1 * | 6/2006 | Ozawa ................ H03F 3/45475 330/254 |
| 2008/0157847 A1 * | 7/2008 | Liu ..................... H03F 3/45183 327/307 |
| 2012/0044006 A1 * | 2/2012 | Kao .................... H03F 3/45475 327/307 |
| 2014/0176238 A1 * | 6/2014 | Guo .................... H03F 3/45475 330/254 |

* cited by examiner

*Primary Examiner* — Tuan T Lam
(74) *Attorney, Agent, or Firm* — WPAT, PC; Justin King

(57) ABSTRACT

A DC offset cancellation circuit is provided. A first DC current and a first sensing current are superposed with each other to generate a first superposed current. A second DC current and a second sensing current are superposed with each other to generate a second superposed current. The first superposed current is converted into a first voltage signal. The second superposed current is converted into a second voltage signal. After the first voltage signal and the second voltage signal are received by a differential amplifier, an output signal is generated. The output signal is processed into a DC value. The DC value is converted into a DC current signal. The superposing unit generates the first DC current and the second DC current according to the DC current signal, so that the first superposed current and the second superposed current have the same DC offset.

5 Claims, 5 Drawing Sheets

DC OFFSET CANCELLATION CIRCUIT

This application claims the benefit of Taiwan Patent Application No. 102148782, filed Dec. 27, 2013, the subject matter of which is incorporated herein by reference.

FIELD OF THE INVENTION

The present invention relates to a DC offset cancellation circuit, and more particularly to a DC offset cancellation circuit for processing a time variant signal.

BACKGROUND OF THE INVENTION

As is well known, a servo motor system is able to precisely control the rotation speed of a servo motor, and has the fast response to acceleration, deceleration and reversion. Due to the precise position control capability and the speed control capability, the servo motor system has been widely used in various industrial automation industries and precision machining fields such as mechanical arms or mechanical work platforms.

FIG. 1A is a schematic functional block diagram illustrating the architecture of a conventional servo motor system. As shown in FIG. 1A, the servo motor system comprises a command device 110, a micro controller 120, a servo motor 130, and an optical encoder 140.

In response to the user's operation, the command device 110 generates a command pulse for controlling a rotation speed and a rotation direction of the servo motor 130. Moreover, according to the rotation speed and the rotation direction of the servo motor 130, the optical encoder 140 generates a feedback pulse to the micro controller 120. Moreover, according to the command pulse and the feedback pulse, the micro controller 120 generates a driving pulse to the servo motor 130.

By the optical encoder 140, a displacement amount of a rotating shaft of the servo motor 130 is transformed into three photoelectronic signals A, B and Z. The photoelectronic signals A, B and Z are transmitted to the micro controller 120. According to the feedback pulse from the optical encoder 140, the micro controller 120 may realize the rotation speed, the rotation direction and the position of the servo motor 130.

For example, the optical encoder 140 is a rotary optical encoder. The optical encoder 140 comprises a light source 142, a photo detector 146, and a disk 148. The disk 148 is coupled to the rotating shaft of the servo motor 130. In addition, the disk 148 is rotated with the servo motor 130. Moreover, after a light beam emitted by the light source 142 passes through gratings of the disk 148, the light beam is received by the photo detector 146. According to the shapes of the gratings of the disk 148, the photo detector 146 generates the photoelectronic signals A, B and Z. During acceleration or deceleration of the servo motor 130, the frequencies and phases of the photoelectronic signals A, B and Z are subjected to changes. In other words, the photoelectronic signals A, B and Z are time variant signals.

Please refer to FIG. 1A again. The first photoelectronic signal A contains an A+ sensing current and an A− sensing current. The second photoelectronic signal B contains a B+ sensing current and a B− sensing current. The third photoelectronic signal Z contains a Z+ sensing current and a Z− sensing current. The way of forming the first photoelectronic signal A and the way of forming the second photoelectronic signal B and the way of forming the third photoelectronic signal Z are identical. Hereinafter, only the way of forming the first photoelectronic signal A will be illustrated, but the way of forming the second photoelectronic signal B and the way of forming the third photoelectronic signal Z will not be redundantly described herein.

FIG. 1B is a schematic timing waveform diagram illustrating the A+ sensing current and the A− sensing current of the first photoelectronic signal A. In the photo detector 146 of the optical encoder 140, two sensing elements are used to generate the A+ sensing current and the A− sensing current. The A+ sensing current and the A− sensing current are photo sensing currents. Obviously, the phase difference between the A+ sensing current and the A− sensing current is 180 degrees.

Moreover, due to the difference between the two sensing elements, the A+ sensing current and the A− sensing current may be suffered from different DC offsets. As shown in FIG. 1B, the A+ sensing current fluctuates between −1.2 μA and −4.2 μA, and the DC offset of the A+ sensing current is −2.7 μA. Moreover, the A− sensing current fluctuates between −1.5 μA and −5.7 μA, and the DC offset of the A− sensing current is −3.6 μA.

As known, the first photoelectronic signal A to be processed by the micro controller 120 should have no DC offset. Consequently, the micro controller 120 should be equipped with a DC offset cancellation circuit to generate the first photoelectronic signal A without the DC offset.

FIG. 2 schematically illustrates a conventional DC offset cancellation circuit. As shown in FIG. 2, the DC offset cancellation circuit 20 comprises a first current-to-voltage converter (I/V) 210, a second current-to-voltage converter 220, a first voltage amplifier 230, a second voltage amplifier 240, a differential amplifier 250, an analog-to-digital converter (ADC) 260, and a digital processing unit (DSP) 270.

After a first sensing unit 202 issues the A+ sensing current to the first current-to-voltage converter 210, the first current-to-voltage converter 210 generates an A+ voltage signal ($V_{A+}$). After the A+ voltage signal (VA+) is inputted into the first voltage amplifier 230, an amplified A+ voltage signal ($GV_{A+}$) is generated.

After a second sensing unit 204 issues the A− sensing current to the second current-to-voltage converter 220, the second current-to-voltage converter 220 generates an A− voltage signal ($V_{A-}$). After the A− voltage signal ($V_{A-}$) is inputted into the second voltage amplifier 240, an amplified A− voltage signal ($GV_{A-}$) is generated.

After the amplified A+ voltage signal ($GV_{A+}$) is received by a positive input end of the differential amplifier 250 and the amplified A− voltage signal ($GV_{A-}$) is received by a negative input end of the differential amplifier 250, the differential amplifier 250 generates the first photoelectronic signal A. After the first photoelectronic signal A is received by the analog-to-digital converter 260, a digitized first photoelectronic signal Ad is generated. After the digitized first photoelectronic signal Ad is received by the digital processing unit 270, a control signal C is generated.

From the above discussions, the DC offset cancellation circuit 20 of FIG. 2 uses the digital processing unit 270 to process the digitized first photoelectronic signal Ad and generate the control signal C according to the DC offset. According to the control signal C, the gain values of the first voltage amplifier 230, the second voltage amplifier 240 and the differential amplifier 250 are correspondingly adjusted. Consequently, the first photoelectronic signal A without the DC offset is outputted from the differential amplifier 250.

FIG. 3 schematically illustrates another conventional DC offset cancellation circuit. As shown in FIG. 3, the DC offset cancellation circuit 30 comprises a first current-to-voltage converter (I/V) 310, a second current-to-voltage converter 320, a differential amplifier 350, an analog-to-digital converter (ADC) 360, a digital processing unit (DSP) 370, and a digital-to-analog converter (DAC) 380.

After a first sensing unit 202 issues the A+ sensing current to the first current-to-voltage converter 310, the first current-to-voltage converter 310 generates an A+ voltage signal ($V_{A+}$). After a second sensing unit 204 issues the A− sensing current to the second current-to-voltage converter 320, the second current-to-voltage converter 320 generates an A− voltage signal ($V_{A-}$).

After the A+ voltage signal ($V_{A+}$) is received by a positive input end of the differential amplifier 350 and the A− voltage signal ($V_{A-}$) is received by a negative input end of the differential amplifier 350, the differential amplifier 350 generates the first photoelectronic signal A. After the first photoelectronic signal A is received by the analog-to-digital converter 360, a digitized first photoelectronic signal Ad is generated.

After the digitized first photoelectronic signal Ad is received by the digital processing unit 370, a control signal C is generated. According to the control signal C, the gain value of the differential amplifier 350 is correspondingly adjusted.

Moreover, the digital processing unit 370 may process the digitized first photoelectronic signal Ad and generate a DC value (DCd) to the digital-to-analog converter 380 according to the DC offset. Consequently, the digital-to-analog converter 380 generates a DC voltage Vdc.

From the above discussions, the DC offset cancellation circuit 30 of FIG. 3 uses the digital-to-analog converter 380 to generate the DC voltage Vdc in order to cancel the DC offset of the first photoelectronic signal A. Consequently, the first photoelectronic signal A without the DC offset is outputted from the differential amplifier 350.

SUMMARY OF THE INVENTION

The present invention provides a novel DC offset cancellation circuit for generating a first photoelectronic signal A without the DC offset.

An embodiment of the present invention provides a DC offset cancellation circuit receiving a first sensing current from a first sensing unit and a second sensing current from a second sensing unit. The DC offset cancellation circuit includes a superposing unit, a first current-to-voltage converter, a second current-to-voltage converter, a differential amplifier, a processing unit, and a current digital-to-analog converter. The superposing unit is used for generating a first DC current and a second DC current. After the first DC current and the first sensing current are superposed with each other by the superposing unit, a first superposed current is generated. After the second DC current and the second sensing current are superposed with each other by the superposing unit, a second superposed current is generated. The first current-to-voltage converter is used for converting the first superposed current into a first voltage signal. The second current-to-voltage converter is for converting the second superposed current into a second voltage signal. The differential amplifier has a first input end receiving the first voltage signal, a second input end receiving the second voltage signal, and an output end generating an output signal. The processing unit is used for receiving the output signal and processing the output signal into a DC value. The current digital-to-analog converter is used for converting the DC value into a DC current signal and issuing the DC current signal to the superposing unit. The superposing unit generates the first DC current and the second DC current according to the DC current signal, so that the first superposed current and the second superposed current have the same DC offset.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 4A:
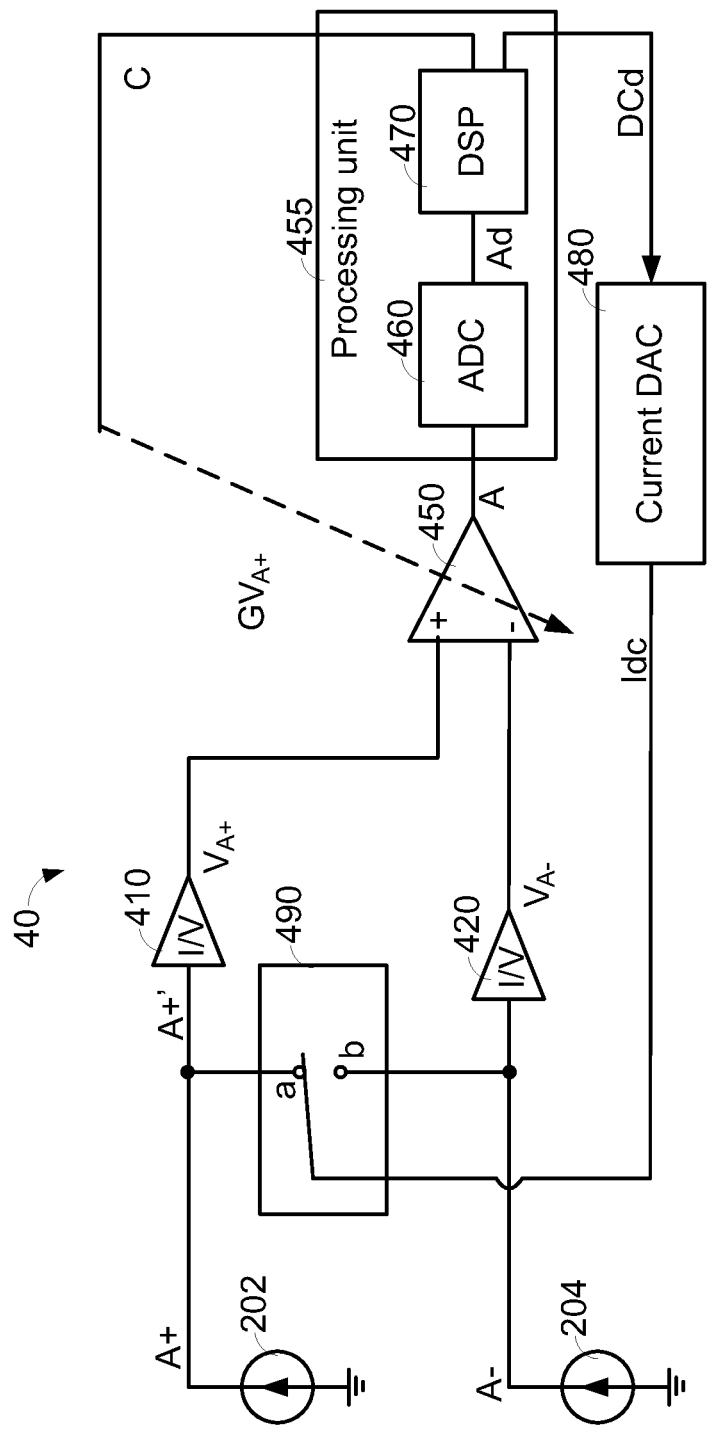
FIG. 4A schematically illustrates a DC offset cancellation circuit according to an embodiment of the present invention.

FIG. 4A schematically illustrates a DC offset cancellation circuit according to an embodiment of the present invention. As shown in FIG. 4A, the DC offset cancellation circuit 40 comprises a first current-to-voltage converter (I/V) 410, a second current-to-voltage converter 420, a differential amplifier 450, a processing unit 455, a current digital-to-analog converter (current DAC) 480, and a superposing unit 490. In addition, the processing unit 455 comprises an analog-to-digital converter (ADC) 460 and a digital processing unit (DSP) 470.

After an A+ sensing current from a first sensing unit 202 is superposed with a DC current signal Idc, a superposed current A+' is generated. After the superposed current A+' is received by the first current-to-voltage converter 410, the first current-to-voltage converter 410 generates an A+ voltage signal ($V_{A+}$).

After an A− sensing current from a second sensing unit 204 is received by the second current-to-voltage converter 420, the second current-to-voltage converter 420 generates an A− voltage signal ($V_{A-}$).

After the A+ voltage signal ($V_{A+}$) is received by a positive input end of the differential amplifier 450 and the A− voltage signal ($V_{A-}$) is received by a negative input end of the differential amplifier 450, the differential amplifier 450 generates the first photoelectronic signal A. After the first photoelectronic signal A is received by the processing unit 455, a control signal C and a DC value (DCd) are generated.

After the first photoelectronic signal A is received by the analog-to-digital converter 460 of the processing unit 455, a digitized first photoelectronic signal Ad is generated. After the digitized first photoelectronic signal Ad is received by the digital processing unit 470 of the processing unit 455, the control signal C is generated. According to the control signal C, the gain value of the differential amplifier 450 is correspondingly adjusted.

Moreover, the digital processing unit 470 may process the digitized first photoelectronic signal Ad and generate the DC value (DCd) according to the DC offset. After the DC value (DCd) is received by the current digital-to-analog converter 480, the DC current signal Idc is generated. By the superposing unit 490, the DC current signal Idc and the A+ sensing current are superposed with each other.

In the DC offset cancellation circuit 40, the DC current signal Idc is superposed with the A+ sensing current to generate the superposed current A+'. Consequently, the superposed current A+' and the A− sensing current have the same magnitude of the DC offset.

Since the differential amplifier 450 is able to eliminate the common mode signal, the DC offsets of the superposed current A+' and the A− sensing current can be completely canceled. Consequently, the first photoelectronic signal A without the DC offset is outputted from the differential amplifier 450.

Figure 1A:
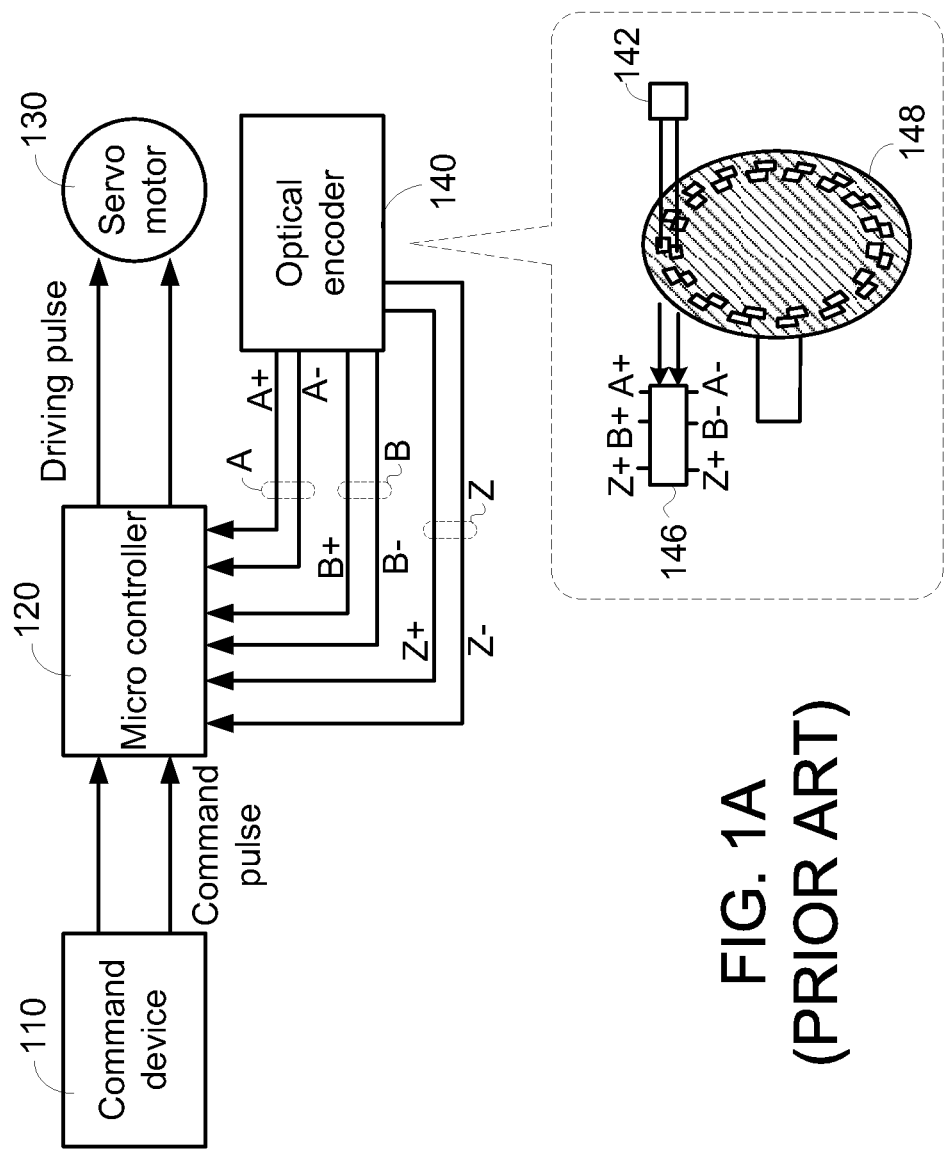
FIG. 1A (prior art) is a schematic functional block diagram illustrating the architecture of a conventional servo motor system.
Figure 1B:
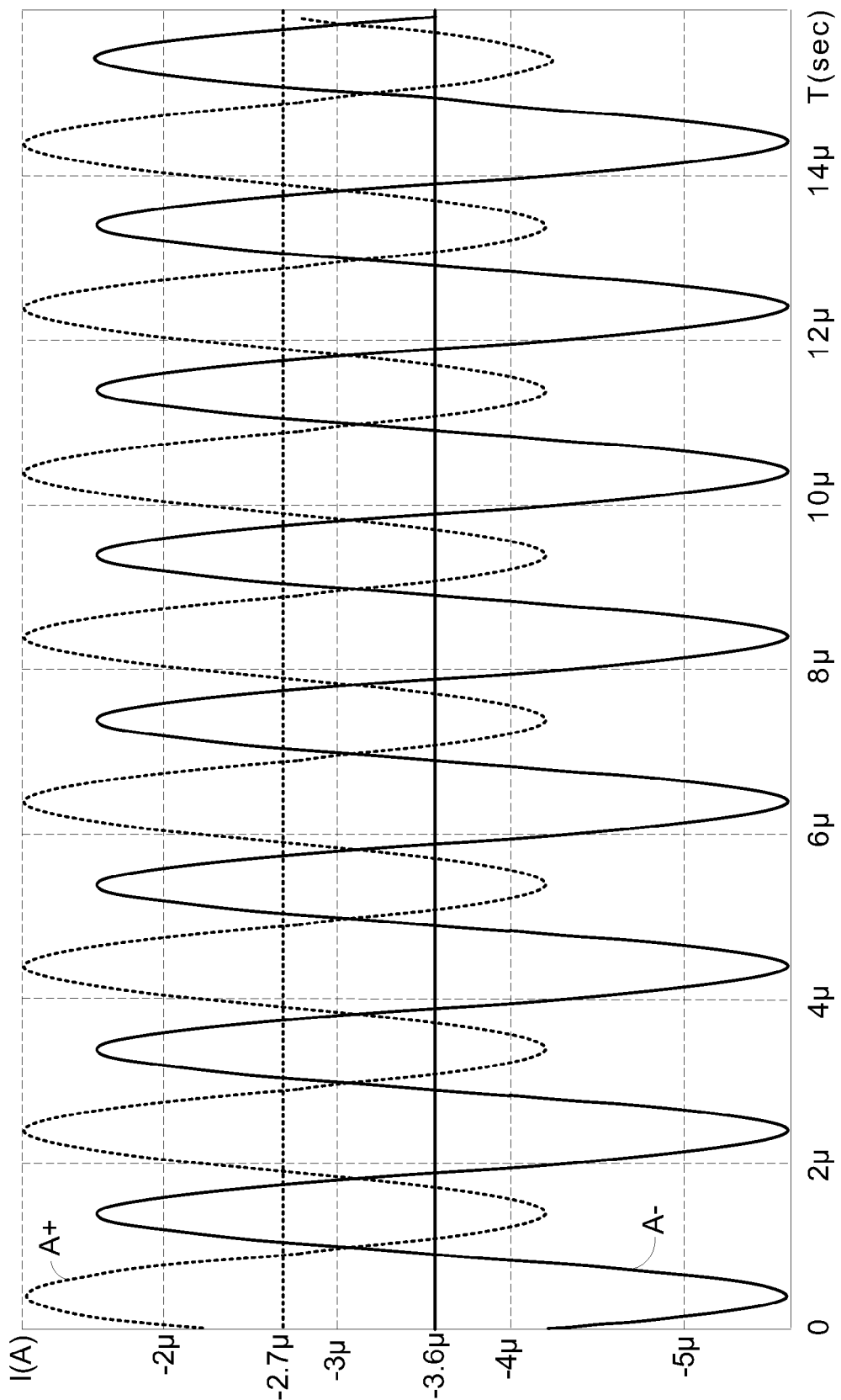
FIG. 1B (prior art) is a schematic timing waveform diagram illustrating the A+ sensing current and the A− sensing current of the first photoelectronic signal A.
Figure 2:
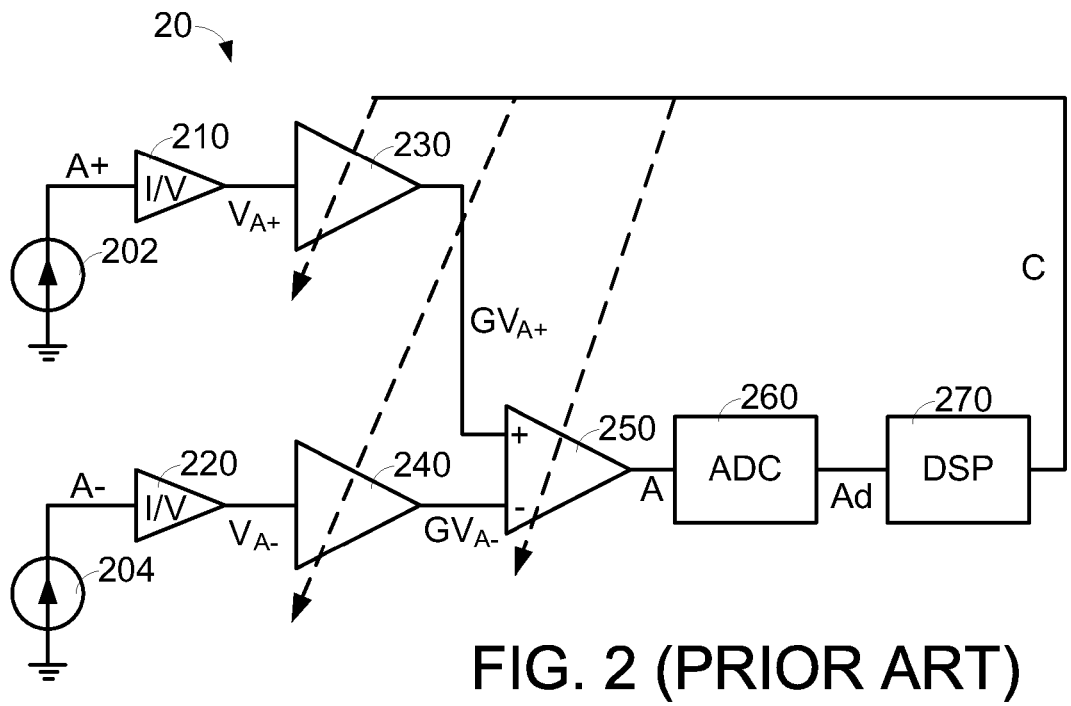
FIG. 2 (prior art) schematically illustrates a conventional DC offset cancellation circuit.
Figure 3:
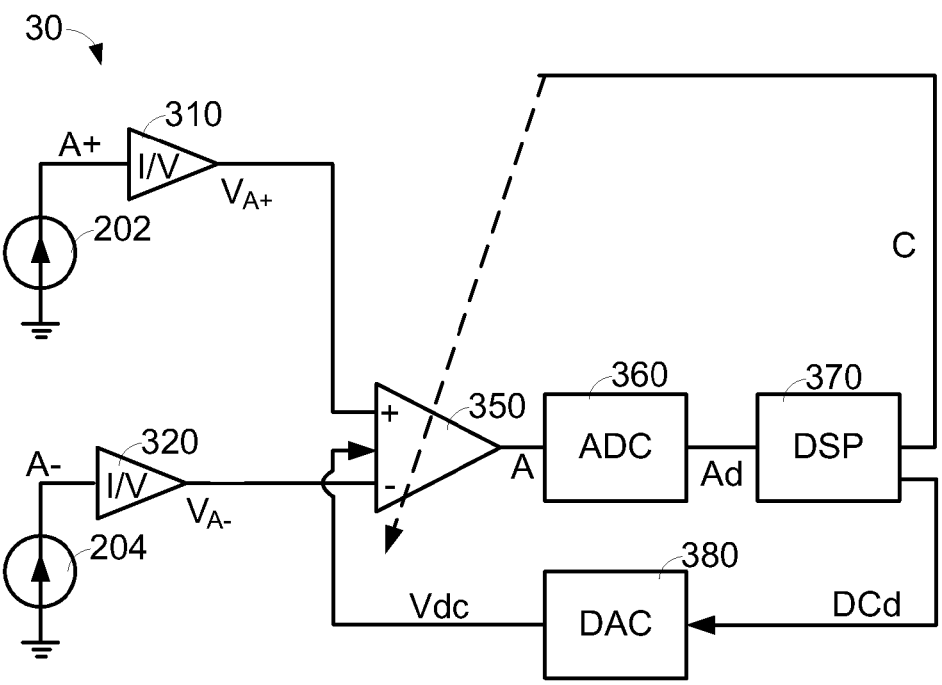
FIG. 3 (prior art) schematically illustrates another conventional DC offset cancellation circuit.
Figure 4B:
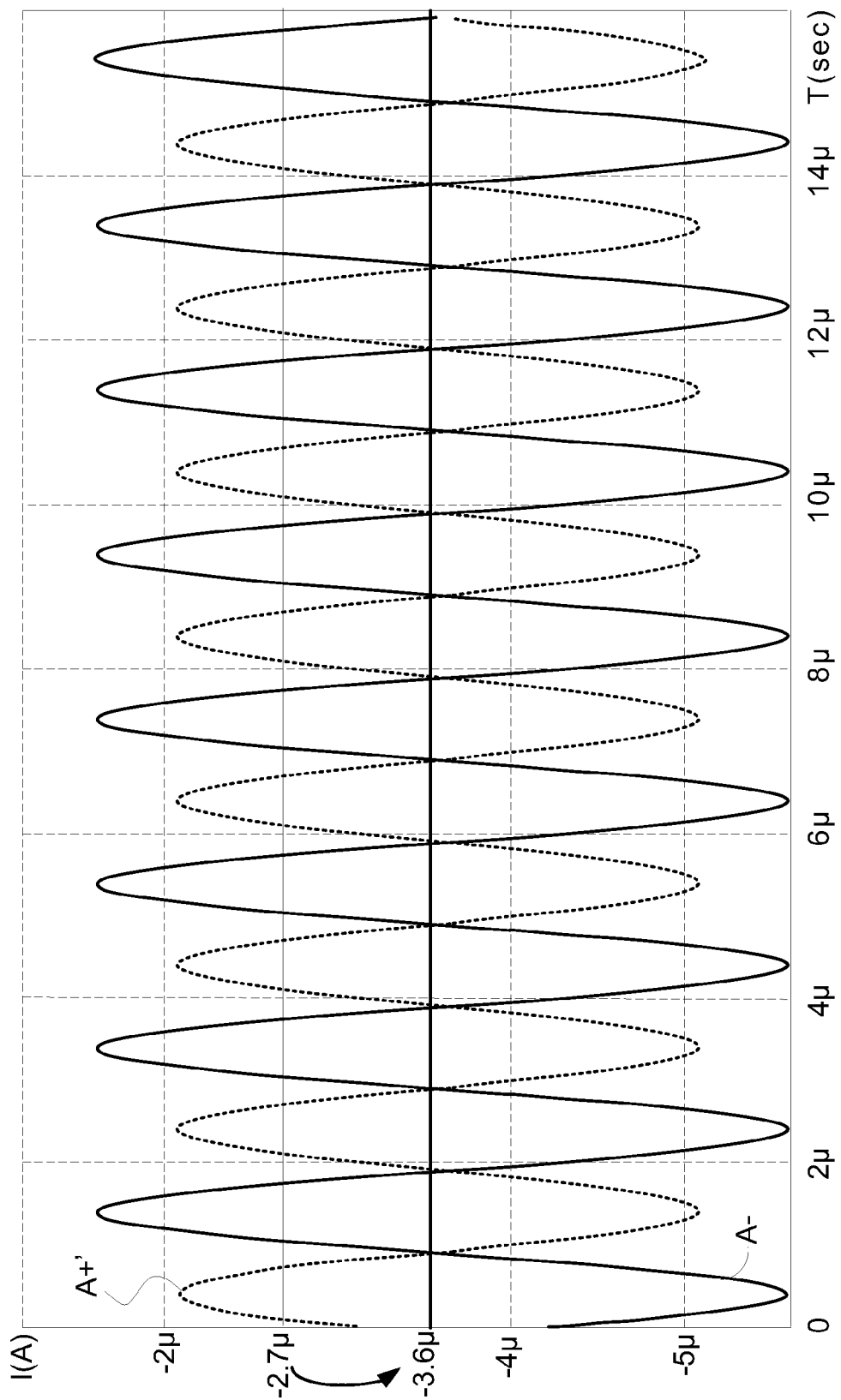
FIG. 4B is a schematic timing waveform diagram illustrating the superposed signal A+' and the A− sensing current of the first photoelectronic signal A processed by the DC offset cancellation circuit according to an embodiment of the present invention.

The A+ sensing current from the first sensing unit 202 and the A− sensing current from the second sensing unit 204 are shown In FIG. 1B. FIG. 4B is a schematic timing waveform diagram illustrating the superposed current A+' and the A− sensing current of the first photoelectronic signal A processed by the DC offset cancellation circuit according to an embodiment of the present invention. As shown in FIG. 4B, the DC current signal Idc generated by the current digital-to-analog converter 480 is −0.9 μA. By the superposing unit 490, the DC current signal Idc and the A+ sensing current are superposed with each other. Consequently, the DC offset of the superposed current A+' is changed from −2.7 μA to −3.6 μA. Under this circumstance, the DC offset of the superposed current A+' is equal to the DC offset of the A− sensing current.

Since the DC offset of the superposed current A+' is equal to the DC offset of the A− sensing current, the DC offset of the A+ voltage signal ($V_{A+}$) and the DC offset of the A− voltage signal ($V_{A-}$) are equal. Since the common mode signal with the same DC offset is eliminated by the differential amplifier 450, the first photoelectronic signal A without the DC offset is outputted from the differential amplifier 450.

Please refer to FIG. 4A again. The DC current signal Idc and the A+ sensing current are superposed with each other through the node "a" of the superposing unit 490, so that the superposed current A+' is generated.

Alternatively, in some other embodiments, the DC current signal Idc and the A− sensing current may be superposed with each other through the node "b" of the superposing unit 490. Under this circumstance, the DC current signal Idc generated by the current digital-to-analog converter 480 is +0.9 μA. After the A− sensing current and the DC current signal Idc are superposed with each other, the DC offset of the superposed current is changed to −2.7 μA. Similarly, the first photoelectronic signal A without the DC offset is outputted from the differential amplifier 450.

Those skilled in the art will readily observe that numerous modifications and alterations may be made while retaining the teachings of the invention. For example, the DC offsets of the A+ sensing current and the A− sensing current may be simultaneously adjusted by more complicated circuitry according to the concepts of the superposing unit 490. For example, if the DC current signal Idc generated by the current digital-to-analog converter 480 is +0.9 μA, a first DC current generated by the superposing unit 490 is −0.45 μA, and a second DC current generated by the superposing unit 490 is +0.45 μA. After the first DC current and the A+ sensing current are superposed with each other, a first superposed current with a DC offset of −3.15 μA is generated. Similarly, after the second DC current and the A− sensing current are superposed with each other, a second superposed current with a DC offset of −3.15 μA is generated. Under this circumstance, the first photoelectronic signal A without the DC offset is outputted from the differential amplifier 450.

From the above descriptions, the present invention provides a DC offset cancellation circuit. After the DC current signal and the sensing current from the sensing unit 202 or 204 are superposed with each other, the DC offset of the superposed current is equal to the DC offset of the other sensing current. Consequently, the purpose of canceling the DC offset is achieved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A DC offset cancellation circuit receiving a first sensing current from a first sensing unit and a second sensing current from a second sensing unit, the DC offset cancellation circuit comprising:
   a superposing unit for generating a first DC current and a second DC current, wherein after the first DC current and the first sensing current are superposed with each other by the superposing unit, a first superposed current is generated, wherein after the second DC current and the second sensing current are superposed with each other by the superposing unit, a second superposed current is generated;
   a first current-to-voltage converter for converting the first superposed current into a first voltage signal;
   a second current-to-voltage converter for converting the second superposed current into a second voltage signal;
   a differential amplifier having a first input end receiving the first voltage signal, a second input end receiving the second voltage signal, and an output end generating an output signal;
   a processing unit for receiving the output signal and processing the output signal into a DC value and a control signal, wherein a gain value of the differential amplifier is correspondingly adjusted according to the control signal; and
   a current digital-to-analog converter for converting the DC value into a DC current signal and issuing the DC current signal to the superposing unit,
   wherein the superposing unit generates the first DC current and the second DC current according to the DC current signal, so that the first superposed current and the second superposed current have the same DC offset.

2. The DC offset cancellation circuit as claimed in claim 1, wherein the processing unit comprises:

an analog-to-digital converter for converting the output signal into a digitized output signal; and a digital processing unit for processing the digitized output signal into the DC value according to a DC offset of the digitized output signal.

3. The DC offset cancellation circuit as claimed in claim 1, wherein the DC current signal is equal to the first DC current and the second DC current is zero, so that the DC offset of the first superposed current is equal to the DC offset of the second sensing current.

4. The DC offset cancellation circuit as claimed in claim 1, wherein the DC current signal is equal to the second DC current and the first DC current is zero, so that the DC offset of the second superposed current is equal to the DC offset of the first sensing current.

5. The DC offset cancellation circuit as claimed in claim 1, wherein the first sensing current from the first sensing unit and the second sensing current from the second sensing unit are both photo sensing currents.

\* \* \* \* \*